United States Patent [19]

Yoshida

[11] Patent Number: 4,841,233
[45] Date of Patent: Jun. 20, 1989

[54] SEMICONDUCTOR INTEGRATED CIRCUIT ADAPTED TO CARRY OUT OPERATION TEST

[75] Inventor: Masanobu Yoshida, Kawaguchi, Japan

[73] Assignee: Fujitsu Limited, Kawasaki, Japan

[21] Appl. No.: 175,667

[22] Filed: Mar. 24, 1988

Related U.S. Application Data

[63] Continuation of Ser. No. 876,456, Jun. 20, 1986, abandoned.

[30] Foreign Application Priority Data

Jun. 20, 1985 [JP] Japan .................. 60-134649

[51] Int. Cl.$^4$ ............ G01R 31/00; G11C 7/00; G11C 29/00
[52] U.S. Cl. .................. 324/73 R; 324/158 R; 371/21; 365/201
[58] Field of Search ............ 324/73 R, 158 R, 73 AT; 371/15, 16, 20, 25; 365/201

[56] References Cited

U.S. PATENT DOCUMENTS

| | | | |
|---|---|---|---|
| 4,168,796 | 9/1979 | Fulks et al. | 324/73 R X |
| 4,194,113 | 3/1980 | Fulks et al. | 324/73 R X |
| 4,419,747 | 12/1983 | Jordan | 365/201 X |
| 4,468,759 | 8/1984 | Kung et al. | 365/201 X |
| 4,608,669 | 8/1986 | Klara et al. | 365/201 |
| 4,630,212 | 12/1986 | Shigeta | 371/21 X |
| 4,672,583 | 6/1987 | Nakaizumi | 365/201 X |
| 4,680,762 | 7/1987 | Hardee et al. | 365/201 X |
| 4,689,772 | 8/1987 | Jordy et al. | 365/201 X |
| 4,701,919 | 10/1987 | Naitoh et al. | 371/21 X |

FOREIGN PATENT DOCUMENTS

0055594 12/1981 European Pat. Off. .
57-105892 1/1982 Japan .

Primary Examiner—Reinhard J. Eisenzopf
Assistant Examiner—Vinh P. Nguyen
Attorney, Agent, or Firm—Staas & Halsey

[57] ABSTRACT

A semiconductor integrated circuit device includes a memory cell array, a decoder circuit, a selection circuit and a plurality of input/output terminals. The selection circuit is connected to one of the terminals and includes a high voltage detector circuit for producing a control signal only when a predetermined voltage higher than a power source voltage is applied to one of the terminals. The selection circuit further includes a latch circuit connected to the terminals other than the one terminal, for latching an input signal in response to a control signal produced from the high voltage detector circuit. When a predetermined high voltage is applied to the high voltage detector circuit through one of the terminals, the signal input from the other terminals is latched, in response to the control signal. The status of the memory cell array and the decoder circuit is made to a predetermined specific mode, based upon the latched signal.

6 Claims, 10 Drawing Sheets

| Fig. 5A | Fig. 5B |
| Fig. 5C | Fig. 5D |

Fig. 7

| STEP | | INPUT TO LATCH $\overline{R}$ | CONTROL INPUT TO LATCH $\phi$ | INPUT S(IN) (INPUT OR INPUT/OUTPUT TERMINAL) | OUTPUT S(LATCH) |
|---|---|---|---|---|---|
| (a) | RESET PROCESS UPON POWER SOURCE ON | L | L | H/L | L |
| (b) | NORMAL MODE (NON-TEST) | H | L | H/L | L |
| (c) | TEST MODE SETTING | H → H | H → H | L → H | L → H |
| (d) | | | | | |
| (e) | TEST MODE EXECUTION | H | L | H/L | H |

SEMICONDUCTOR INTEGRATED CIRCUIT ADAPTED TO CARRY OUT OPERATION TEST

This is a continuation of co-pending application Ser. No. 876,456 filed on June 20, 1986 now abandoned.

BACKGROUND OF THE INVENTION

1. Field of the Invention

The present invention relates to a semiconductor integrated circuit adapted to carry out an operation test. In particular, it relates to a semiconductor integrated circuit having a multiplexed functional selection circuit which enables the integrated circuit to be set to a conventional operation mode as well as other operation modes, for example, a test operation mode.

2. Description of the Related Arts

In general, the operational efficiency of semiconductor integrated circuits is checked after manufacture, to ensure that the circuits will function properly in normal use, for example, when subjected to conditions of normal use, for example, when subjected to conditions of normal user operation. This check is carried out by a test operation, and is applied generally to simple logic circuits.

A memory usually contains a combination of many input patterns, and therefore, a long time is needed for carrying out a test of the circuits therein. in some cases, however, whether an internal circuit is operating normally cannot be determined clearly by a conventional input pattern, and a problem arises in that a satisfactory test of the circuit cannot be carried out.

SUMMARY OF THE INVENTION

It is an object of the present invention to provide an improved semiconductor integrated circuit adapted to carry out an operation test in which various modes of testing the integrated circuit can be selected under the condition that only a small number of input-only terminals are utilized, and by which a reliable operation test of the integrated circuit can be carried out under such a condition.

In accordance with the present invention, there is provided a semiconductor integrated circuit device adapted to carry out an operation test, including: a memory cell array; a decoder circuit; a selection circuit; and a plurality of input or output terminals. The selection circuit includes: a high voltage detector circuit connected to one of the input or output terminals, for outputting a control signal only when a predetermined voltage higher than a power source voltage is applied to one of the input or output terminals, and a latch circuit connected to terminals other than the input or output terminals for latching an input signal in response to a control signal delivered from the high voltage detector circuit.

The memory cell array and the decoder circuit carry out an operation of the integrated circuit device in a regular mode by means of a signal input through the terminals, when a voltage is applied to the high voltage detector circuit through one of the terminals, whereby the statuses of the memory cell array and the decoder circuit are brought to a predetermined special mode, based upon the latched signal, when a predetermined high voltage is applied to the high voltage detector circuit through one of the terminals, and the signal input from other terminals is latched in response to the control signal produced from the high voltage detector circuit.

BRIEF DESCRIPTION OF THE DRAWINGS

FIG. 7 is a diagram showing the function of the latch circuit in FIG. 6 and the test mode.

DESCRIPTION OF THE PREFERRED EMBODIMENTS

To enable a clearer understanding of the present invention, the operation of a multiplexed function optional circuit in accordance with a prior art memory will be described hereinafter with reference to FIGS. 1 and 2.

Figure 1:
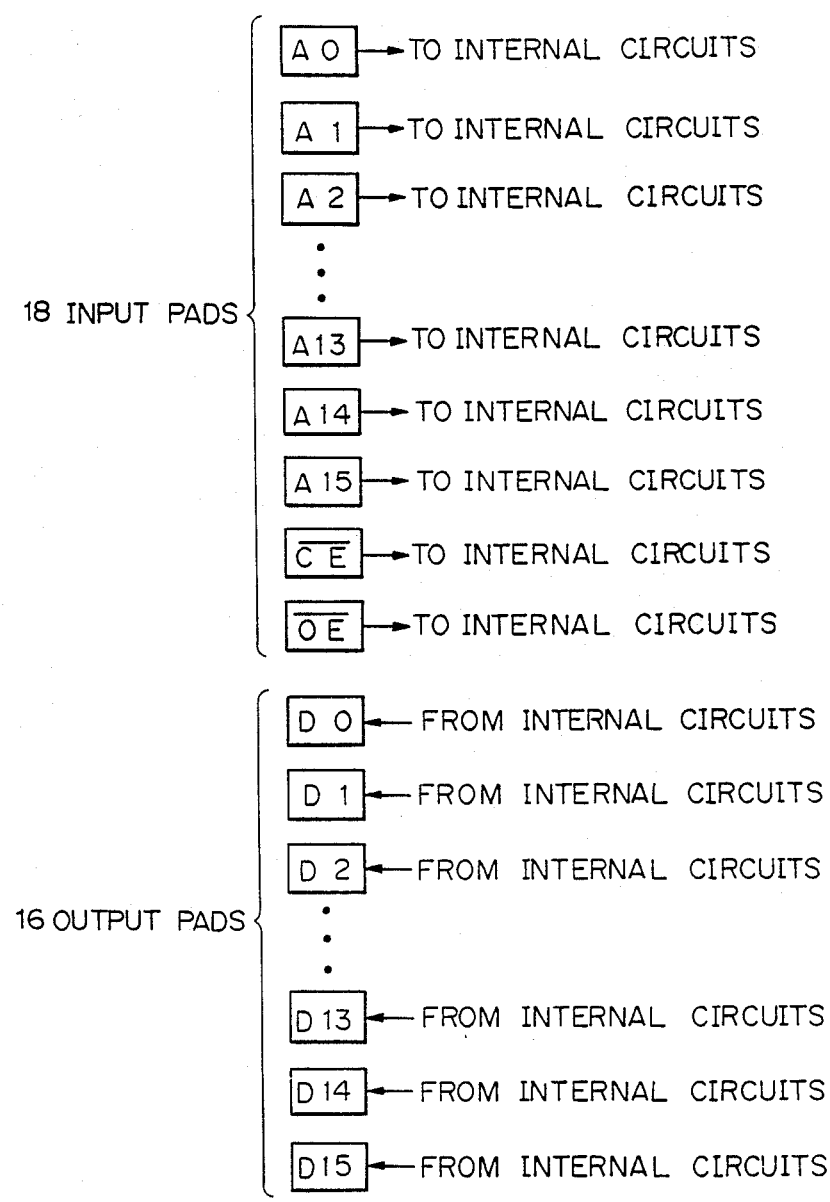
FIG. 1 illustrates an outline of a prior art pad.
Figure 2:
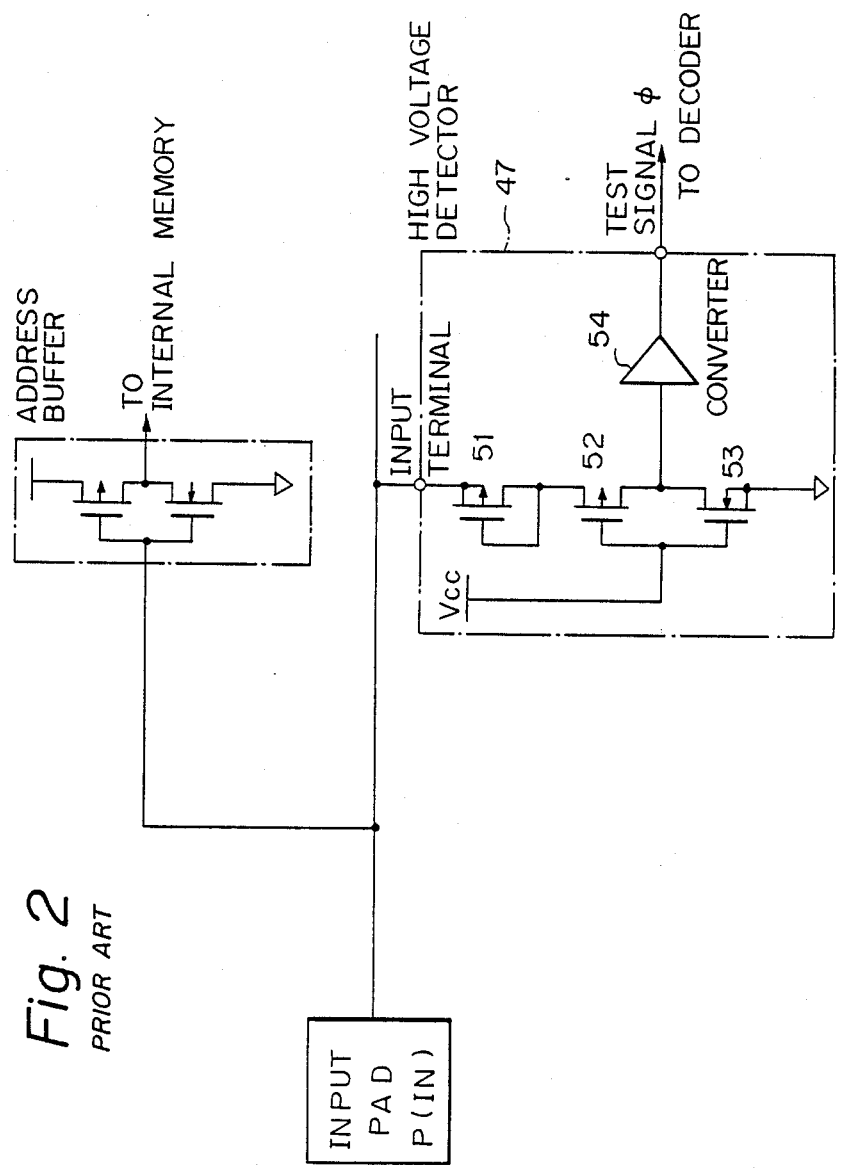
FIG. 2 is a block diagram of a prior art high voltage detector circuit and address buffer in an integrated circuit.

As shown in FIGS. 1 and 2, a high voltage detector circuit is connected as a multiple selection circuit to an input terminal. Connected to the voltage detector circuit is a decoder circuit, which is set to a definite circuit status for a test mode by the output signal of the high voltage detector circuit. When the potential of an output signal from the high voltage detector circuit is LOW, the decoder circuit of a memory operates in a normal state. The input terminal other than that for the high voltage detector circuit is connected to an input buffer circuit, the output of which is directed to an internal circuit of a memory. Recently, there has been a trend toward an increase of width of the output side of the semiconductor integrated circuit, such as the adaptation of 16 bits or the like to a microcomputer, but this means that it becomes necessary to correspondingly enhance the number of input or output terminals in a memory. This increase in the number of terminals, however, leads to an undesirable increase in the size of the elements.

FIG. 1 shows an outline of a prior art pad. In this field, the term "pad" is often applied to edge connectors, which are circuit terminals on a printed circuit board. FIG. 1 shows a pad configuration of a 1M bit EPROM, which includes, as an example, 18 inputs and 16 outputs. Among these 18 inputs, ten are utilized to carry out a test operation.

Thus, a method is adopted wherein an input buffer and an output buffer are connected to the same terminal, to avoid an increase in the number of input and output terminals, and this method can improve the number of input and output terminals necessarily utilized. As described above, in a test mode it is necessary to apply a voltage higher than the power source voltage $V_{cc}$ to an input terminal. Accordingly, an input/output terminal which is connected to an input buffer and an output buffer can not be employed as a test terminal. This is because, with regard to a memory of CMOS structure, when a high voltage is applied to such an input/output terminal, a forward current of a diode which is connected between an output terminal of a data output buffer and the power source $V_{cc}$ flows in the direction of the power source $V_{cc}$, and thus the application of a high voltage can not be detected by the high voltage detector circuit. Accordingly, an attempt has been made to provide an input terminal for exclusive use in carrying out a test because of the increase in the number of input/output terminal for common use, the number of input terminal for exclusive use must be decreased. Therefore, a problem arises in that a satisfactory test mode can be set, and thus a positive and reliable test cannot be carried out.

An example of the high voltage detector circuit having CMOS transistors used in a prior art semiconductor integrated circuit is shown in FIG. 2. In FIG. 2, a circuit diagram of a high voltage detector circuit 47 utilizing a CMOS is described. In FIG. 2, 51 and 52 denote a pair of P-channel transistors, 53 and 54 N-channel transistor, and 54 a converter. An input terminal is connected to the source of a P-channel transistor 51.

Figure 3:
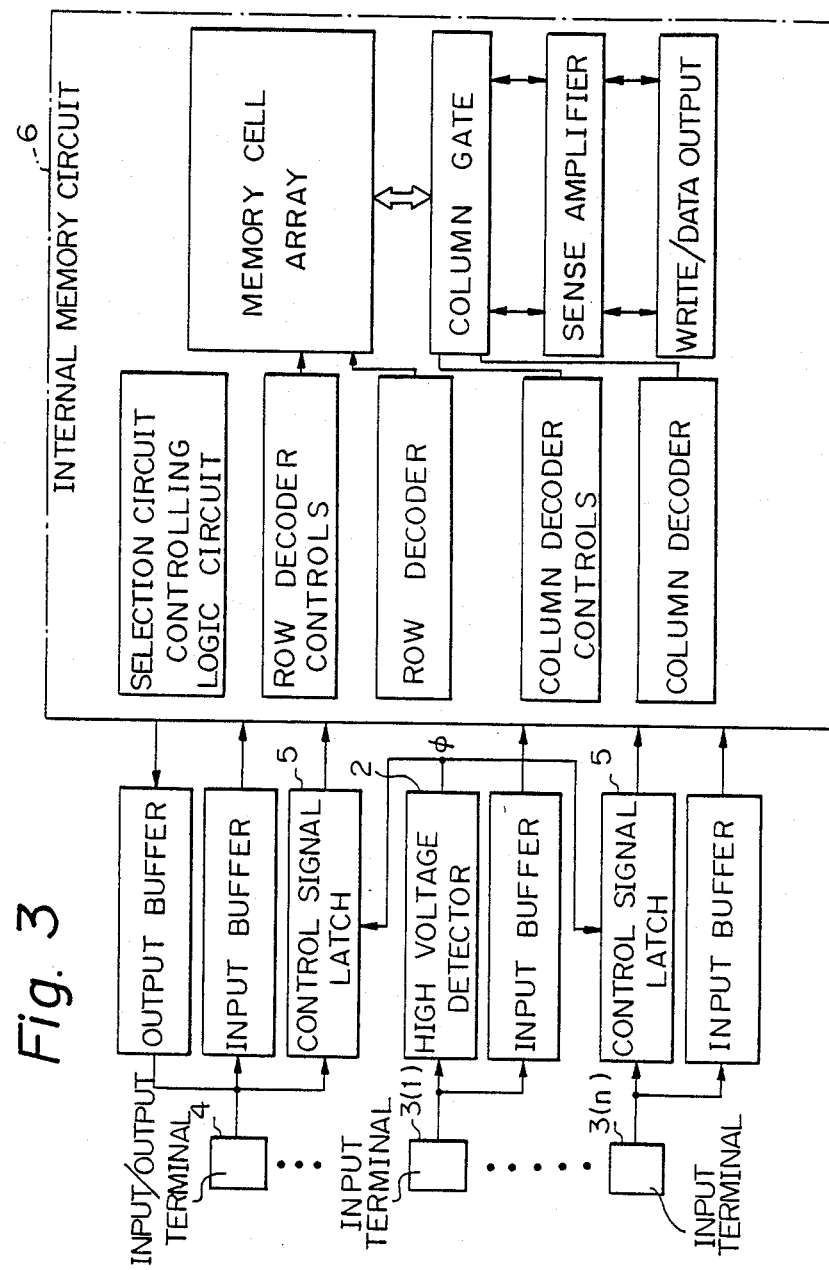
FIG. 3 is a schematic block diagram showing the semiconductor integrated circuit an embodiment of in accordance with the present invention.

The semiconductor integrated circuit adapted to carry out an operation test according to an embodiment of the present invention will now be described with reference to FIGS. 3 to 6. As shown in FIG. 3, an input/output terminal 4 and each of the input terminals 3(1)–3(n) are employed during the test made to input the control signals to latch circuits 5 and, the outputs of the latch circuits 5 are utilized as test mode signals. On the other hand, a signal from an input/output terminal is sent, during the regular mode operation, through an address buffer to an internal memory, or an output signal from the internal memory is sent through an output buffer to an input/output terminal. The internal memory can include an erasable programmable read only memory.

During regular mode operation a first control signal latch circuit 5 is connected to the input/output terminal 4 and a second control signal latch circuit 5 is connected to the input terminal 3(n). The control signals output from the control signal latch circuit 5 denote the regular mode. The output signal from the internal memory circuit 6 is output to the input/output terminal 4 by way of an output buffer. The signal to be input to the internal memory 6 is input from the input/output terminal 4 or the input terminals 3(1)–3(n) by way of input buffers.

During a test mode operation, a voltage higher than the power source voltage is applied to the input terminal 3(1). A signal $\phi$ is produced by a high voltage detector 2 and is delivered to each control signal latch circuit 5. In response to the signal $\phi$, each control signal latch circuit 5 latches the input signal to the terminals 4 and 3(n), respectively, to output a signal denoting the test mode. As there are two control latch circuits 5 in FIG. 3, one or both of the two types of tests (regular mode or test mode) may be carried out, or the circuits may be switched over to execute one of the tests.

The operation of the prior art multiple selection circuit will now be described. At a normal operation, a voltage applied to a power source $V_{cc}$ is equivalent to a high level voltage applied to the input terminal, for example, 5 Volts. Then, as the transistors 51 and 52 turn OFF and the N-channel transistor 53 turns ON, a high voltage detector signal is made low level through a converter 54. Therefore, the decoder circuit is a normal operation mode and carries out a normal memory operation.

On the contrary, if the voltage applied to the power source $V_{cc}$ is, for example, 5 Volts in a testing mode, the high level voltage applied to the input terminal is higher than the voltage applied to the power source, for example, 12 Volts. Then, the pair of P-channel transistors 51 and 52 and the N-channel transistor 53 all turn ON, but because of a small gm value at the N-channel transistor the output is at a high level. Therefore, the decoder circuit 48 is set to a test mode (for example, a selection state of all word lines), and thus a predetermined test can be executed. Accordingly, in a test mode, a voltage higher than the power source voltage $V_{cc}$ must be applied to the input terminal.

Figure 6:
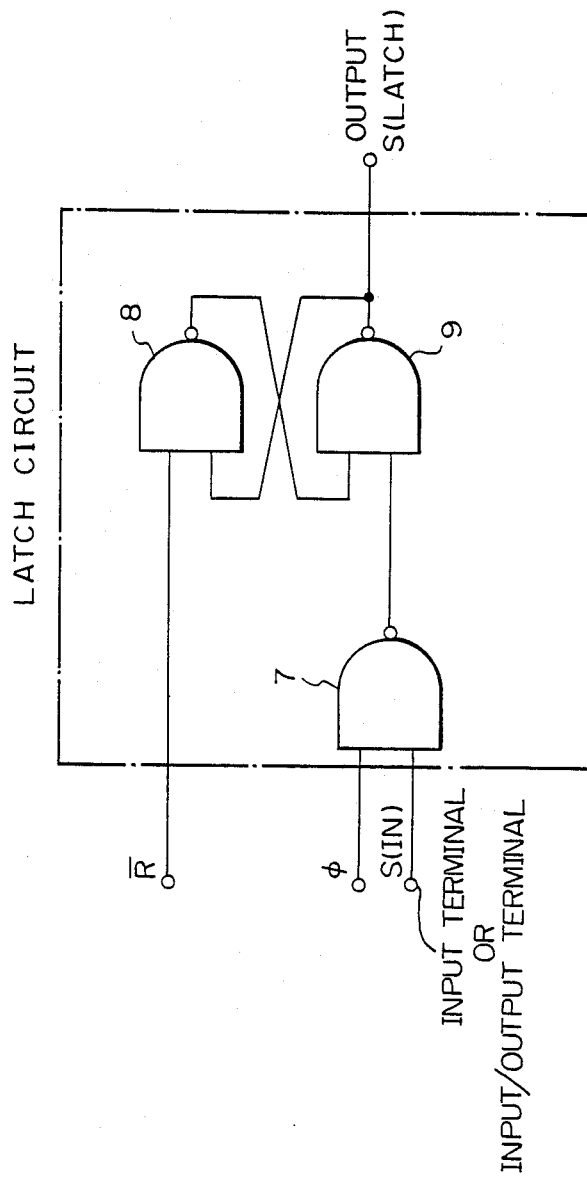
FIG. 6 is a circuit diagram showing a control signal latch circuit of the memory circuit in FIG. 5.

FIG. 6 is a block diagram of a latch circuit for a control signal in accordance with an embodiment of the present invention. In FIG. 6, reference numerals 7, 8, and 9 denote each two-point NAND gate circuit, $\overline{R}$ denotes an input for a power ON reset signal, which sets the latch circuit in a reset state by a low level signal pulse produced when the power source voltage is input. $\phi$ is a control signal supplied from the high voltage detector circuit, and S(IN) and S(LATCH) denote an input signal and a latch signal, respectively.

Referring to a truth table in FIG. 7, the operation of the circuit according to the embodiment will be described. In the figure, "L" denotes a low signal level and "H" a high signal level, and "H/L" may be used as either "H" or "L".

When the power source rises, an "L" pulse is generated from an $\overline{R}$ terminal, the circuit is reset, and the output S(LATCH) is initialized to an "L" status (Step(a)). This status is latched and remains the same even if the signal level of the $\overline{R}$ terminal is "H" (Step(b)).

When the output is "L", a normal signal is input to the input terminal or input/output terminal to enable an inherent integrated circuit operation to be carried out.

Then, a high voltage for a test mode setting is input to a high voltage detector circuit, and thus the control signal $\phi$ is changed from "L" to "H". When the input terminal (or input/output terminal) is "L", the output S(LATCH) remains as "L" (Step(c)). When the input terminal (or input/output terminal) becomes "H", the output S(LATCH) is "H" (Step(d)). When the output S(LATCH) is "H", a predetermined circuit of the integrated circuit connected thereto is set to a test mode. This status remains the same even if the control signal $\phi$ is changed from "H" to "L" and does not depend on the level of the input/output terminal (Step(e)).

According to a circuit of an embodiment of the invention, when the circuit is once set to a test mode status, as the test mode state is maintained by a latch circuit, it is not necessary to constantly apply a high voltage throughout a test period, in the prior art. Since a control signal latch circuit is constituted so as to operate at a normal voltage level, the circuit can be connected not only to an input terminal but also to an input/output terminal, to utilize the signal input from these terminals for a test setting. Therefore, the kinds of test setting modes can be enhanced to a great extent to enable a reliable test to be carried out.

A normal operation mode and a test mode which is determined by an output S(LATCH) will be concretely described.

Figure 4:
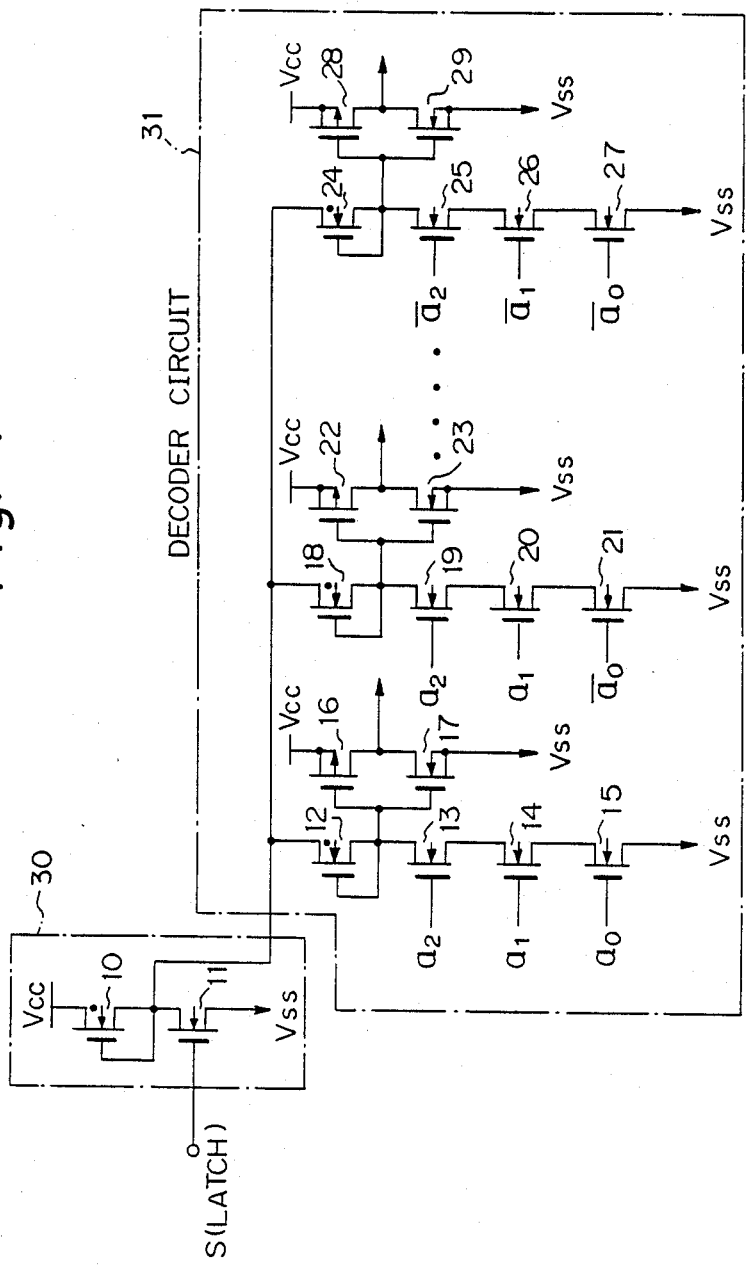
FIG. 4 is a block diagram showing a decoder control circuit and decoder circuit in the circuit of FIG. 3.

FIG. 4 shows a circuit diagram of a decoder control circuit 30 and a decoder 31 in accordance with an embodiment of the present invention. In FIG. 4, reference numerals 10, 12, 18, and 24 denote N-channel depletion type transistors; 11, 13 to 15, 17, 19 to 21, 23, 25 to 27, and 29 denote N-channel enhancement type transistors, and 16, 22, and 28 denote P-channel enhancement type transistors. The $g_m$ of the N-channel transistor 11 is assumed to be comparatively large, each $a_i$ (i=0, 1, 2) denotes an address signal and each $\bar{a}_i$ is an inverted signal.

The operation of the circuit will be now described.

When the output S(LATCH) is "L", the transistor 11 in the decoder control circuit 30 turns OFF, and the power source voltage of each NAND circuit in the decoder circuit 31 is $V_{cc}$, so that the decoder circuit operates in a normal mode. On the contrary, when the output S(LATCH) is "H", the transistor 11 turns ON to make the output voltage of the decoder control circuit 30 $V_{ss}$. Therefore, as all outputs of each NAND circuit are $V_{ss}$, all outputs of the decoder circuit also are "H", and set in a test mode, i.e., the so-called selection of all word lines mode.

Figures 5, 5A:
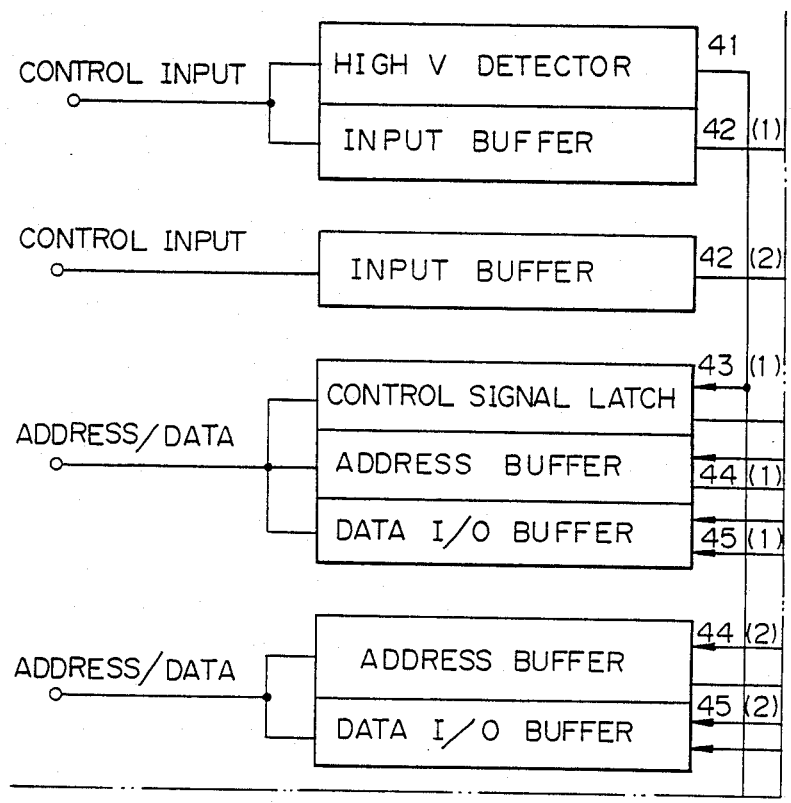
FIG. 5 (including FIGS. 5A-5D) is a block diagram showing a semiconductor integrated circuit of FIG. 3
FIGS. 5A and 5C illustrate a high voltage detector, an input buffer, an address buffer, data input/output buffer, and a control signal latch which are connected to external circuits.
Figure 5B:
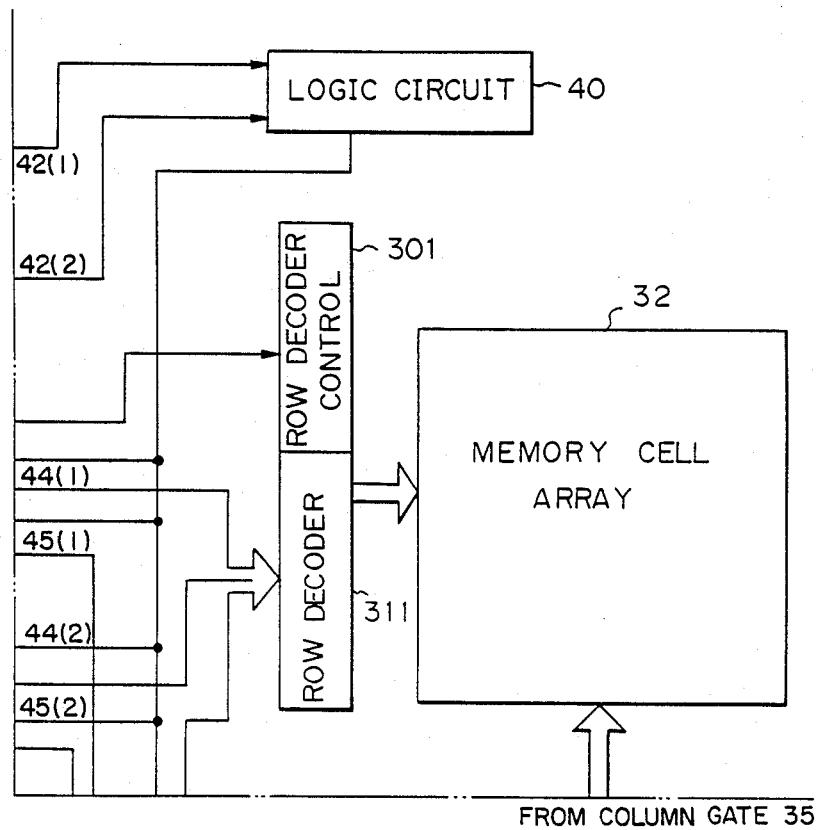
FIG. 5B illustrates a row decoder and memory cell array which receives address signals from the circuit shown in FIGS. 5A and 5C.
Figure 5C:
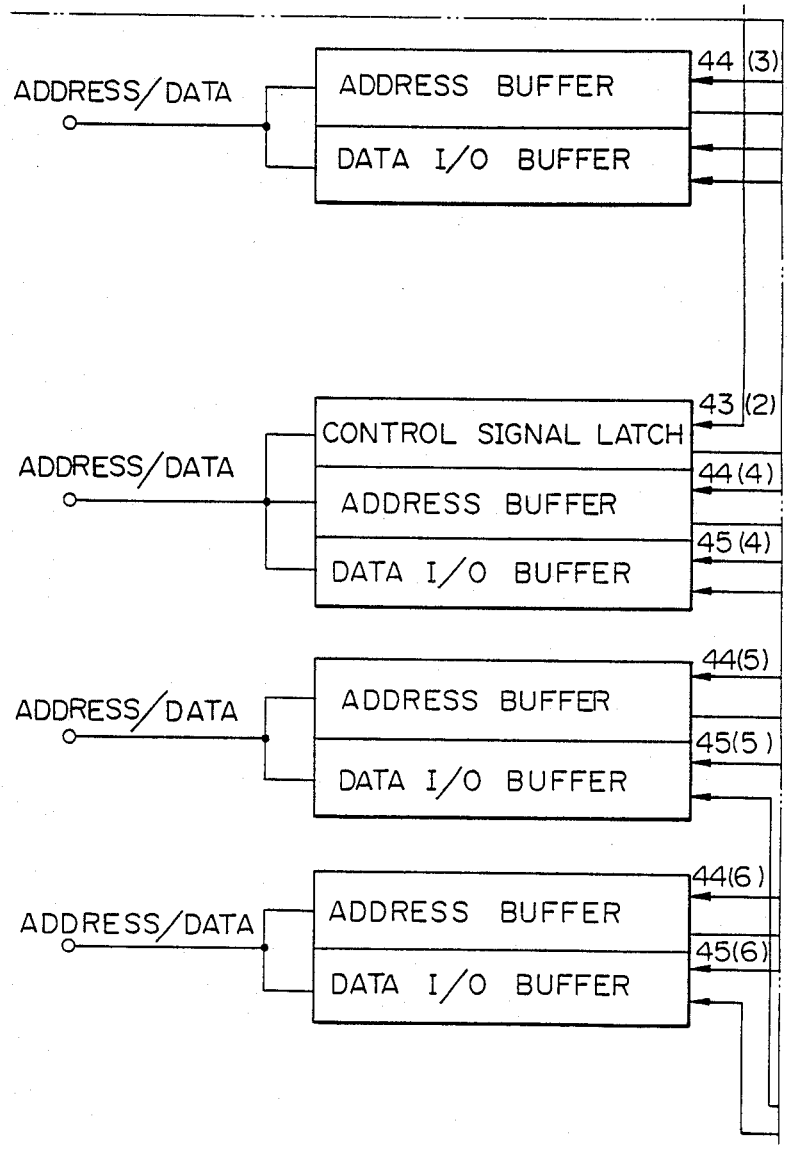
Figure 5D:
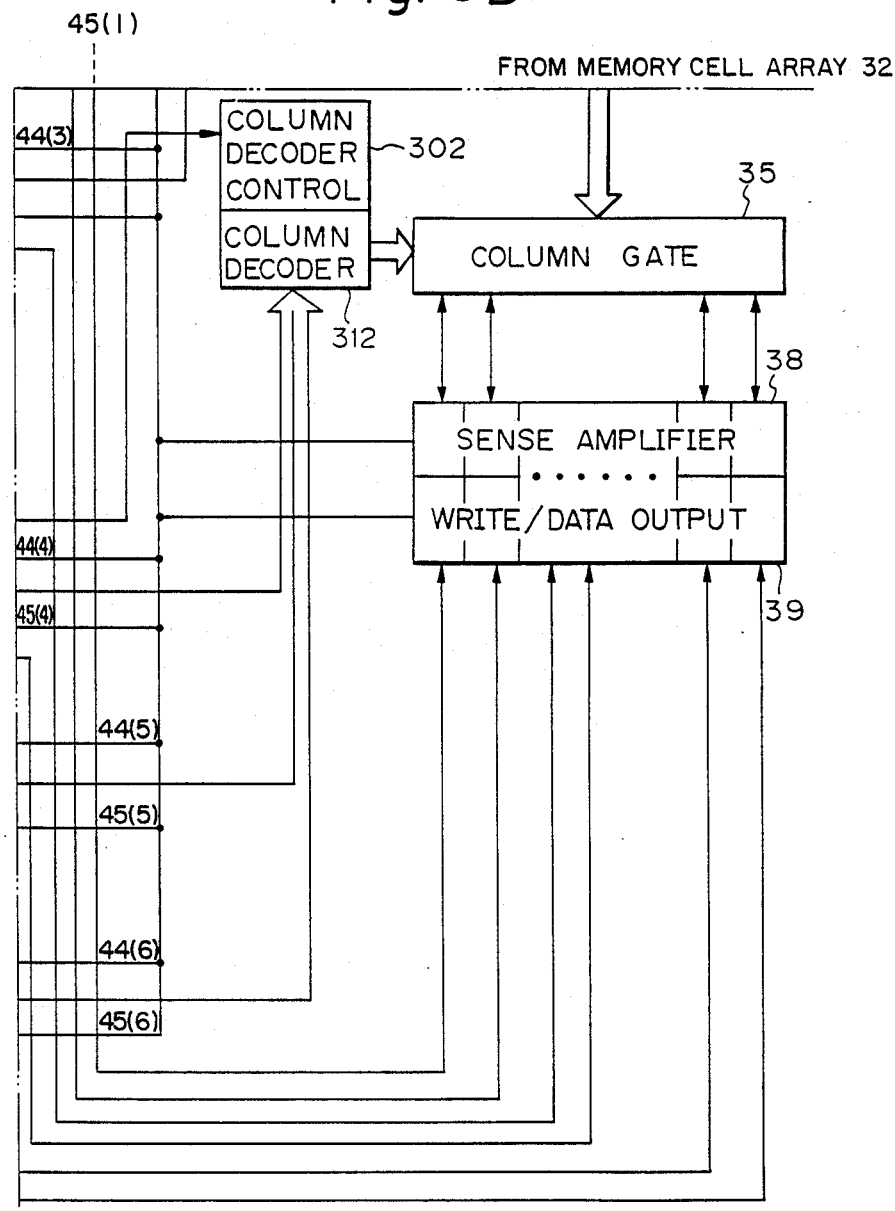
FIG. 5D illustrates a column decoder which receives address signals from the circuits shown in FIGS. 5A and 5C, and from data input/output portions.

FIG. 5 (including FIGS. 5A-5D) is a block diagram showing a semiconductor integrated circuit device according to an embodiment the present invention. In FIG. 5 reference numeral 32 denotes a memory cell array, 301 a row decoder control circuit, 311 a row decoder circuit, 35 a column gate circuit, 302 a column decoder control circuit, 312 a column decoder circuit, 38 a sense amplifier, 39 a write/data output circuit, 40 a logic circuit, 41 a high voltage detector circuit, 42(1) and 42(2) input buffer circuits, 43(1) and 43(2) control signal latch circuits, 44(1) to 44(6) address buffer circuits, and 45(1) to 45(6) data input/output buffer circuits. In the figure, the Address/Data terminals are those used for both address multiplexing and as input-/output terminals.

The operation of the semiconductor integrated circuit device of FIG. 5 will now be outlined. When a normal voltage level is input to each terminal, an inherent functional operation as in known memory circuits, that is, write and read of data, can be carried out.

On the one hand, when a test mode setting voltage higher than the power source voltage through a control input terminal is input to the high voltage detector circuit 41, a control signal $\phi$ is output to the control signal latch circuits 43(1) and 43(2) from the high voltage detector circuit 41. A signal input to the control signal latch circuit 43(1) via an address/data terminal is stored in the control signal latch circuit 43(1) in response to the control signal $\phi$. A signal applied to the control signal latch circuit 43(2) is also stored in the control signal latch circuit 43(2) in response to the control signal $\phi$. The test mode setting signal is produced from the control signal latch circuits 43(1) and 43(2). The test mode setting signal is input, for example, to a row decoder control circuit 301, as shown in FIG. 5, the row decoder circuit 311, which can not be set by a normal operation mode, is set to the selection of all word lines modes. Thus, the predetermined operational test can be carried out. As in the row decoder circuit, 311 a column decoder circuit 312 also can be set to the selection of all word lines mode.

From the foregoing description of the present invention, it can be concluded that, in response to a high voltage detecting signal produced when the high voltage for test setting use is input from one input terminal, an input signal from other input terminals or the input-/output terminals is latched to set a semiconductor integrated circuit to the desired test mode. Thus, the present invention is advantageous in that many kinds of test modes can be set and the testing time is shortened, whereby a reliable operation can be ensured.

I claim:

1. A semiconductor integrated circuit device adapted to carry out a test operation, comprising:
   an internal memory circuit operating under one of a normal mode and test mode, including:
   a memory cell array;
   a row decoder circuit coupled to said memory cell array;
   a column gate circuit coupled to said memory cell array; and
   a column decoder circuit coupled to said column gate circuit;
   a plurality of input and output terminals connected to said internal memory circuit;
   a high voltage detector circuit, connected to one of said input and output terminals, for outputting a control signal only when a predetermined voltage higher than a power source voltage is applied to one of said input and output terminals;
   latch means, connected to said row and column decoders, to said internal memory circuit and to one of said input and output terminals not connected to said high voltage detector circuit, for latching an input signal in response to said control signal from said high voltage detector circuit;
   buffer means, connected to said latch means and said internal memory circuit, for receiving input and output signals; and
   selection means, coupled to said buffer means, for selecting one of the normal mode and test mode of said internal memory circuit in accordance with the input signal latched by said latch means.

2. A semiconductor integrated circuit device according to claim 1, wherein said memory cell array comprises a plurality of word lines connected to said row decoder circuit, and
   wherein said row decoder circuit comprises a circuit for selecting all of said word lines during the test mode.

3. A semiconductor integrated circuit device according to claim 1, wherein said buffer means includes address buffers and input/output buffers.

4. A semiconductor integrated circuit device comprising:
   an internal circuit operating under a plurality of modes;
   first and second terminals operatively connected to said internal circuit;
   a high voltage detecting circuit, connected to said first terminal, for generating a control signal when a predetermined voltage, which is higher than a power source voltage for said internal circuit, is applied to said first terminal; and
   a latch circuit, connected to said second terminal, said internal circuit, and said high voltage detecting circuit, for latching a signal applied to said second terminal in response to the control signal, wherein one of a plurality of modes is selected according to the signal stored in said latch circuit.

5. A semiconductor integrated circuit device according to claim 4, wherein said internal circuit is an internal memory circuit.

6. A semiconductor integrated circuit device according to claim 4, wherein said plurality of modes include a normal mode and a test mode for testing said internal circuit.

* * * * *